United States Patent
Weng

(10) Patent No.: US 10,379,581 B1
(45) Date of Patent: Aug. 13, 2019

(54) WATERPROOF COVER STRUCTURE AND MONITOR

(71) Applicants: LITE-ON ELECTRONICS (GUANGZHOU) LIMITED, Guangzhou (CN); Lite-On Technology Corporation, Taipei (TW)

(72) Inventor: Chen-Cheng Weng, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/012,774

(22) Filed: Jun. 20, 2018

(30) Foreign Application Priority Data

Mar. 30, 2018 (CN) .................. 2018 2 0448162 U

(51) Int. Cl.
*A47B 81/00* (2006.01)
*G06F 1/18* (2006.01)

(52) U.S. Cl.
CPC ...... *G06F 1/182* (2013.01); *G06F 2200/1633* (2013.01)

(58) Field of Classification Search
CPC .. H05K 5/061; G06F 1/182; G06F 2200/1633
USPC ......................................................... 312/100
See application file for complete search history.

(56) References Cited

U.S. PATENT DOCUMENTS

| | | | | |
|---|---|---|---|---|
| 4,980,516 A | * | 12/1990 | Nakagawa | H05K 9/0015 174/358 |
| 5,588,731 A | * | 12/1996 | Schmidt | B29C 44/1233 312/405 |
| 2015/0040484 A1 | * | 2/2015 | Olch | H05K 5/069 49/465 |
| 2015/0075080 A1 | * | 3/2015 | Ellingson | E06B 7/2309 49/483.1 |
| 2015/0097471 A1 | * | 4/2015 | Bailey | H05K 5/061 312/100 |

* cited by examiner

*Primary Examiner* — Matthew W Ing
(74) *Attorney, Agent, or Firm* — JCIPRNET

(57) ABSTRACT

A waterproof cover structure including a cover body and a waterproof sealing ring is provided. The cover body has a disposition surface and includes a ring-shaped rib. The ring-shaped rib is located on the disposition surface and adjacent to an edge of the disposition surface. The waterproof sealing ring is detachably assembled onto the cover body and has a ring-shaped slot. The ring-shaped rib is embedded in the ring-shaped slot, so as to fix the waterproof sealing ring onto the cover body.

8 Claims, 4 Drawing Sheets

WATERPROOF COVER STRUCTURE AND MONITOR

CROSS REFERENCE TO RELATED APPLICATION

This application claims the priority benefit of China application serial no. 201820448162.5, filed on Mar. 30, 2018. The entirety of the above-mentioned patent application is hereby incorporated by reference herein and made a part of specification.

BACKGROUND

Field of the Invention

The invention relates to a cover structure and an electronic device and more particularly, to a waterproof cover structure and a monitor including the waterproof cover structure.

Description of Related Art

Along with the increase in demands for monitors, people install monitors not only indoors, the demands for installing the monitors outdoors are also gradually increased day by day. However, the monitors installed outdoors have to be up against wind, sun and rain, and thus, a waterproof function is a must-have requirement for the outdoor monitors; otherwise, water penetrating therein may cause damages to the machines and increase to users' acquisition cost. Furthermore, a cover body of a monitor available on the market, in order to be sealed with a main body, needs several screws for locking and fixing. Thus, a user, when needing to open the monitor by himself/herself for, for example, adjusting a lens angle or pulling out or inserting a secure digital (SD) card, has to use a tool to disassemble the cover body, such that assembly cost may be increased due to the screws being dropped or lost when the cover body is assembled, which is quite inconvenient and time-consuming. In addition, to prevent the cover body from dropping when the monitor is opened, a hanging-preventing line is usually additionally provided to be connected to the cover body, which increases the cost for assembly and production of the monitor.

SUMMARY

The invention provides a waterproof cover structure capable of providing a waterproof effect along with convenience in use.

The invention provides a monitor including the aforementioned waterproof cover structure and having a preferable waterproof effect and convenience in use.

A waterproof cover structure of the invention includes a cover body and a waterproof sealing ring. The cover body has a disposition surface and includes a ring-shaped rib. The ring-shaped rib is located on the disposition surface and adjacent to an edge of the disposition surface. The waterproof sealing ring is detachably assembled onto the cover body and has a ring-shaped slot. The ring-shaped rib is embedded in the ring-shaped slot, so as to fix the waterproof sealing ring onto the cover body.

In an embodiment of the invention, the waterproof cover structure further includes a hanging-preventing portion disposed on the disposition surface of the cover body. The hanging-preventing portion is located in the ring-shaped rib, and the hanging-preventing portion and the waterproof sealing ring are integrally formed.

In an embodiment of the invention, the cover body further includes a locking portion disposed at an outer side of the ring-shaped rib and located on the disposition surface.

In an embodiment of the invention, the locking portion and the the ring-shaped rib are integrally formed.

A monitor of the invention includes a main body and a waterproof cover structure. The main body has a first pair of side surfaces opposite to each other and a second pair of side surfaces opposite to each other. The waterproof cover structure is detachably assembled onto the main body. The waterproof cover structure includes a cover body and a waterproof sealing ring. The cover body has a disposition surface and includes a ring-shaped rib. The ring-shaped rib is located on the disposition surface and adjacent to an edge of the disposition surface. The waterproof sealing ring is detachably assembled onto the cover body and has a ring-shaped slot. The ring-shaped rib is embedded in the ring-shaped slot, so as to fix the waterproof sealing ring onto the cover body. When the waterproof cover structure is assembled onto the main body, the waterproof sealing ring abuts on the first pair of side surfaces and the second pair of side surfaces.

In an embodiment of the invention, the waterproof cover structure further includes a hanging-preventing portion disposed on the disposition surface of the cover body, and the hanging-preventing portion and the waterproof sealing ring are integrally formed. When the waterproof cover structure is assembled onto the main body, the hanging-preventing portion is fixed on the main body.

In an embodiment of the invention, the main body includes a first locking portion, the cover body further includes a second locking portion, and the second locking portion is disposed at an outer side of the ring-shaped rib and located on the disposition surface. When the waterproof cover structure is assembled onto the main body, the second locking portion corresponds to the first locking portion.

In an embodiment of the invention, the second locking portion and the the ring-shaped rib are integrally formed.

In an embodiment of the invention, a shape contour of the waterproof cover structure is a rectangular shape.

In an embodiment of the invention, when the waterproof cover structure is assembled onto the main body, the waterproof cover structure and the main body are coplanar.

To sum up, in the design of the waterproof cover structure of the invention, the ring-shaped rib of the cover body is embedded in the ring-shaped slot of the waterproof sealing ring, such that the waterproof sealing ring can be fixed onto the cover body, thereby forming the waterproof cover structure capable of waterproofing. In addition, as for the monitor of the invention, its waterproof sealing ring of the waterproof cover structure abuts on the first pair of side surfaces and the second pair of side surfaces of the main body, such that the waterproof cover structure can be assembled onto the main body, thereby achieving the effect of preventing water from penetrating into the main body. In other words, the main body of the monitor and the waterproof cover structure of the invention can be assembled to each other, without the use of screws, which may have a shorter assembly time, less assembly cost and preferable assembly convenience.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
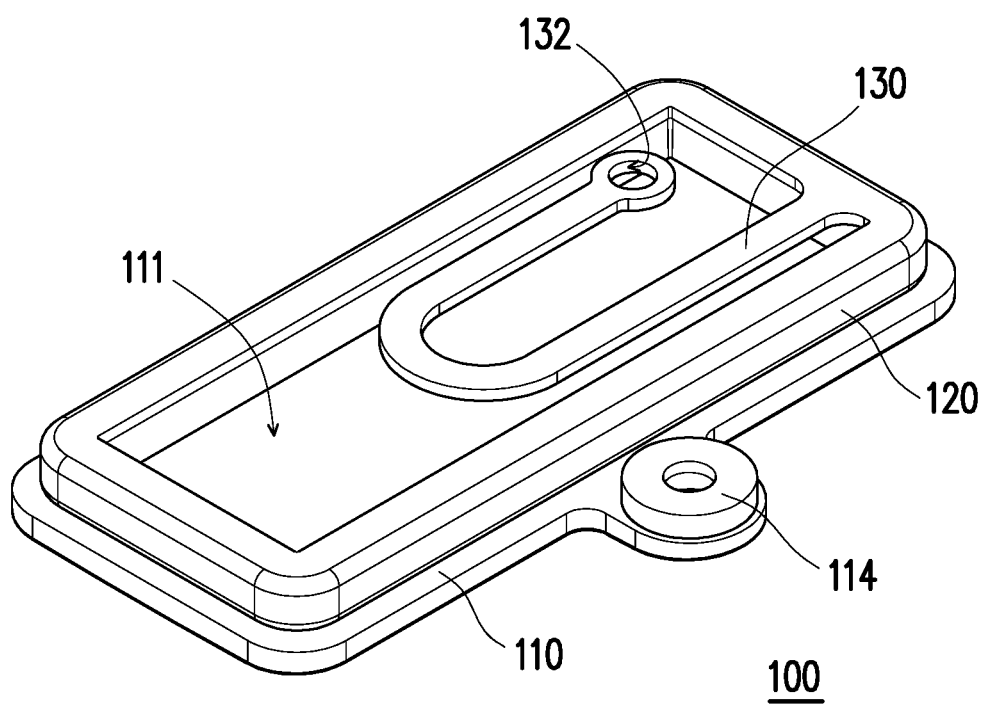
FIG. 1A is a schematic perspective view showing a waterproof cover structure according to an embodiment of the invention.
Figure 1B:
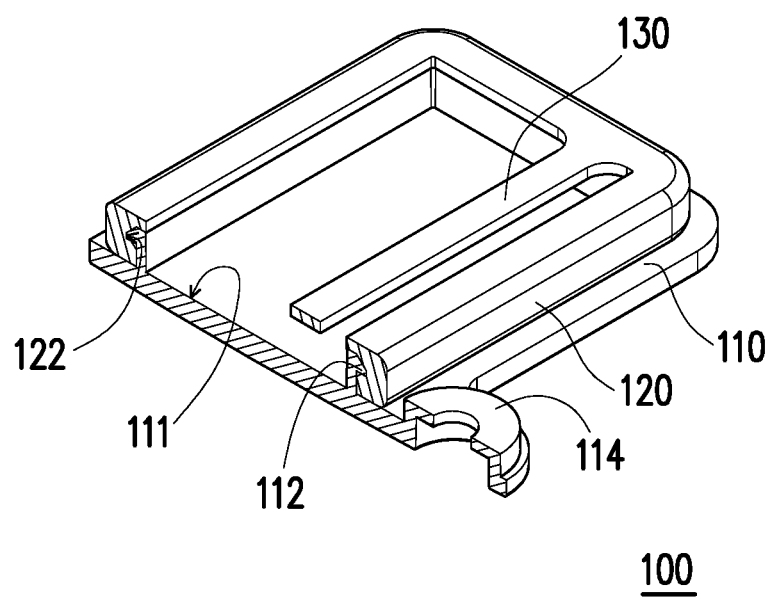
FIG. 1B is a partial schematic cross-sectional perspective view showing the waterproof cover structure depicted in FIG. 1A.

FIG. 1A is a schematic perspective view showing a waterproof cover structure according to an embodiment of the invention. FIG. 1B is a partial schematic cross-sectional perspective view showing the waterproof cover structure depicted in FIG. 1A.

Referring to FIG. 1A and FIG. 1B simultaneously, in the present embodiment, a waterproof cover structure 100 including a cover body 110 and a waterproof sealing ring 120 is provided. The cover body 110 has a disposition surface 111 and includes a ring-shaped rib 112. The ring-shaped rib 112 is located on the disposition surface 111 and adjacent to an edge of the disposition surface 111. The waterproof sealing ring 120 is detachably assembled onto the cover body 110 and has a ring-shaped slot 122. The ring-shaped rib 112 is embedded in the ring-shaped slot 122, so as to fix the waterproof sealing ring 120 onto the cover body 110. In this case, the cover body 110 is, for example, a plastic cover body or a metal cover body, but the invention is not limited thereto. A material of the waterproof sealing ring 120 is, for example, rubber capable of waterproofing.

To be detailed, in the waterproof cover structure 100 of the present embodiment, its waterproof sealing ring 120 and the cover body 110 are fixed to each other through the ring-shaped rib 112 being embedded in the ring-shaped slot 122. Thus, the assembly may have a shorter assembly time and preferable assembly convenience. Furthermore, the waterproof cover structure 100 of the present embodiment further includes a hanging-preventing portion 130 disposed on the disposition surface 111 of the cover body 110. The hanging-preventing portion 130 is located in the ring-shaped rib 112, and the hanging-preventing portion 130 and the waterproof sealing ring 120 are integrally formed. In other words, the hanging-preventing portion 130 and the waterproof sealing ring 120 are an integrally formed structure, the hanging-preventing portion 130 and the waterproof sealing ring 120 are made of the same material and thus, both are capable of waterproofing. Therefore, in comparison with the related art where the hanging-preventing line has to be additionally provided to be connected to the cover body, the design of the present embodiment that the hanging-preventing portion 130 and the waterproof sealing ring 120 are integrally formed may effectively reduce the cost for elements, assembly and production.

In addition, the cover body 110 of the present embodiment further includes a locking portion 114 (i.e., a second locking portion) disposed at an outer side of the ring-shaped rib 112 and located on the disposition surface 111. In this case, the locking portion 114 and the the ring-shaped rib 112 are integrally formed. A shape contour of the locking portion 114 is, for example, a hollow circular shape, and a shape contour of the ring-shaped rib 112 is, for example, a rectangular shape, but the invention is not limited thereto.

Figure 2A:
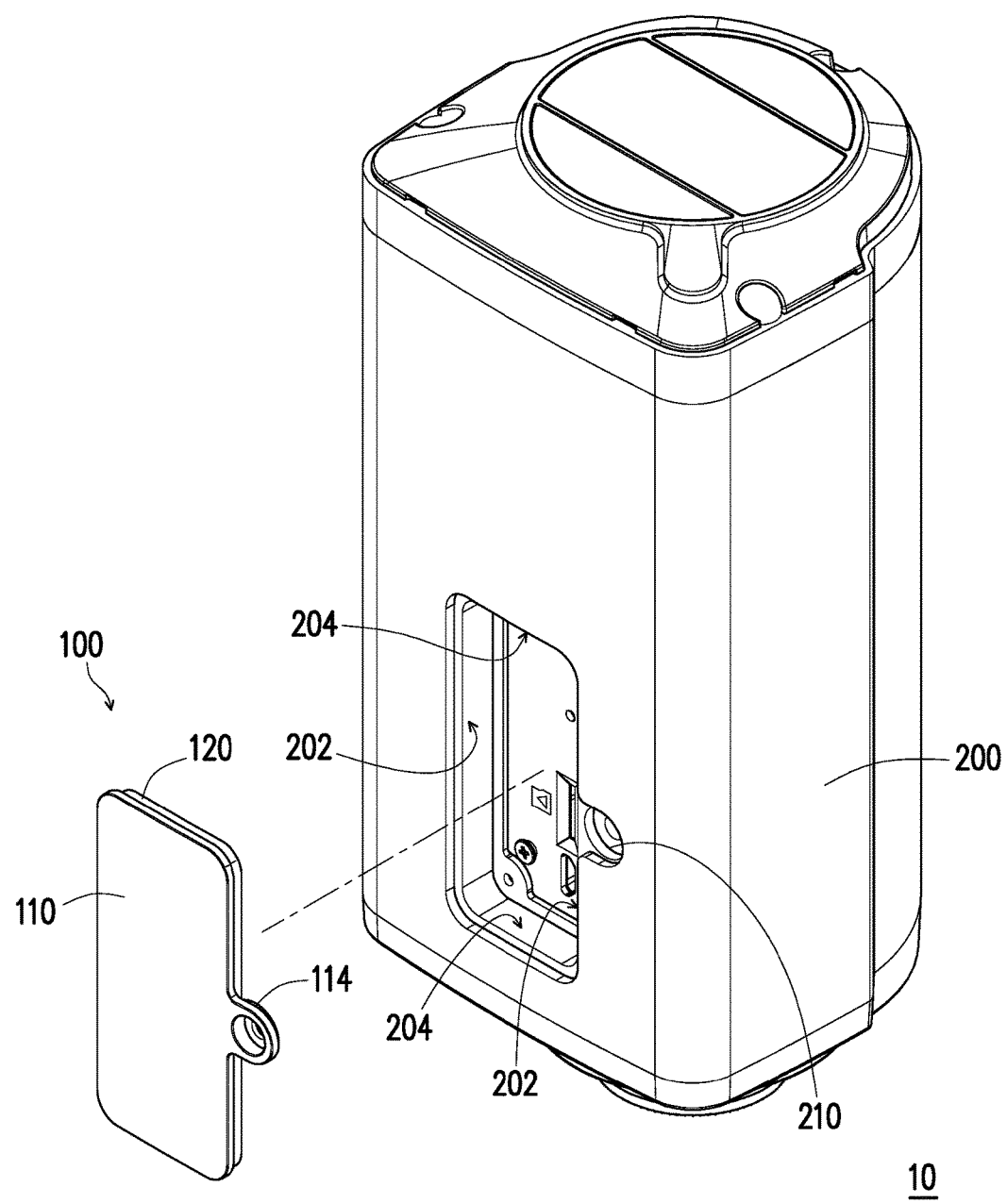
FIG. 2A is a schematic exploded perspective view illustrating a monitor according to an embodiment of the invention.
Figure 2B:
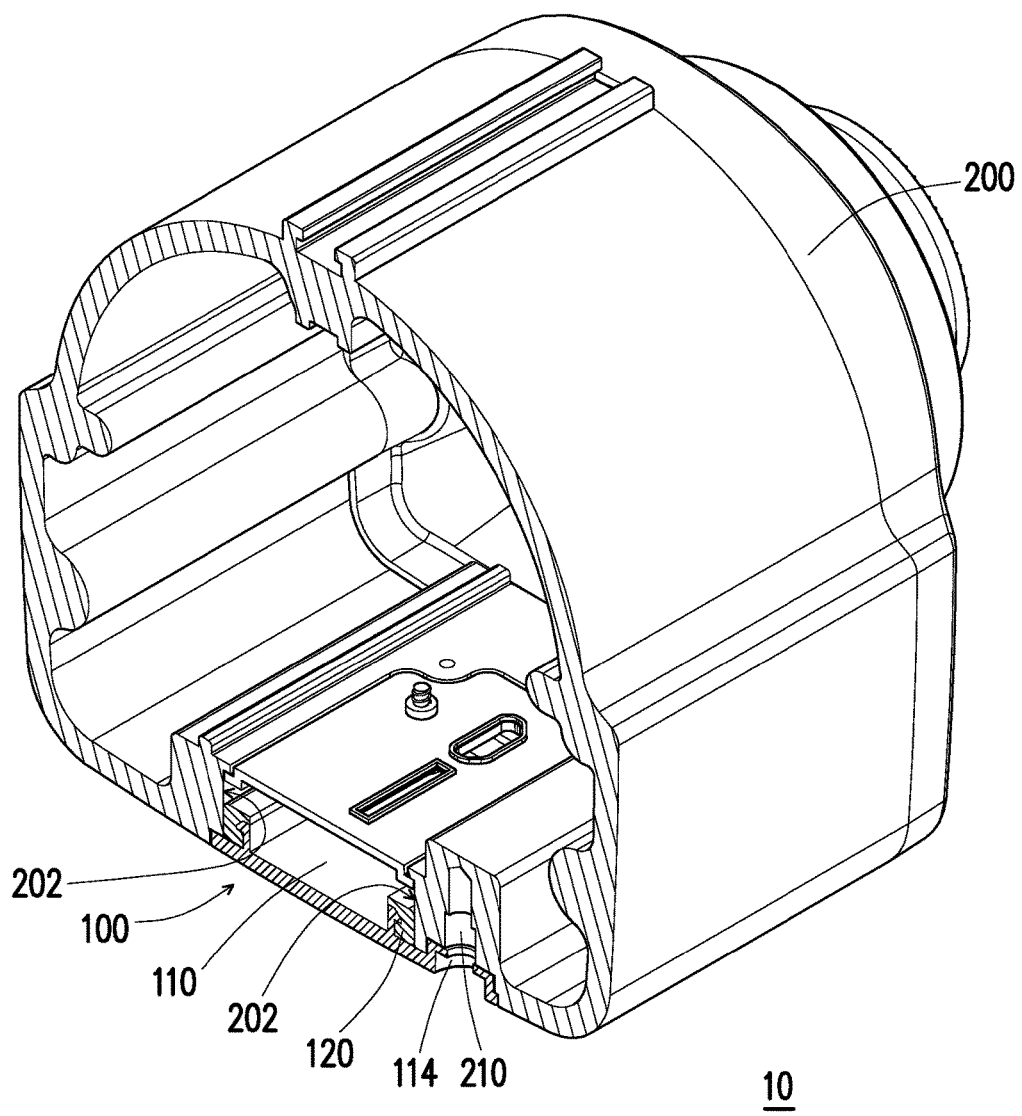
FIG. 2B is a partial schematic cross-sectional perspective view showing the monitor depicted in FIG. 2A.

FIG. 2A is a schematic exploded perspective view illustrating a monitor according to an embodiment of the invention. FIG. 2B is a partial schematic cross-sectional perspective view showing the monitor depicted in FIG. 2A. Referring to FIG. 2A and FIG. 2B simultaneously, in the present embodiment, a monitor 10 includes a main body 200 and the waterproof cover structure 100 of the embodiment described above. The waterproof cover structure 100 is detachably assembled onto the main body 200. The main body 200 has a first pair of side surfaces 202 opposite to each other and a second pair of side surfaces 204 opposite to each other. When the waterproof cover structure 100 is assembled onto the main body 200, the waterproof sealing ring 120 abuts on the first pair of side surfaces 202 and the second pair of side surfaces 204 of the main body 200. In this circumstance, the waterproof cover structure 100 and the main body 200 are coplanar. A shape contour of the waterproof cover structure 100 is, for example, a rectangular shape. Certainly, in other embodiments that are not shown, the shape contour of the waterproof cover structure may also be circular, elliptic or other suitable shapes, but the invention is not limited thereto.

As the waterproof sealing ring 120 of the waterproof cover structure 100 of the present embodiment is fixed on the main body 200 by abutting on the first pair of side surfaces 202 and the second pair of side surfaces 204 of the main body 200, i.e., the waterproof sealing ring 120 applies a pressure to the first pair of side surfaces 202 and the second pair of side surfaces 204 of the main body 200, such that the waterproof sealing ring 120 is closed to the main body 200 to achieve a waterproof effect. In other words, the assembly of the main body 200 and the waterproof cover structure 100 of the monitor 10 in the present embodiment does not require any screws, which may have a shorter assembly time, less assembly cost and preferable assembly convenience. Therefore, a user, when needing to open the monitor 10, does not disassemble the waterproof cover structure 100 through any tool, and thus, the issues that the assembly cost is increased due to the screws being dropped or lost does not occur.

Furthermore, the waterproof cover structure 100 of the present embodiment also has a hanging-preventing portion 130 integrally formed with the waterproof sealing ring 120. The hanging-preventing portion 130 has an assembly hole 132 (referring to FIG. 1A). When the waterproof cover structure 100 is assembled onto the main body 200, the assembly hole 132 may be assembled onto the main body 200, so as to be positioned on the main body 200. When the user opens the monitor 10 to disassemble the waterproof cover structure 100, the waterproof cover structure 100 may be prevented from being dropped as the assembly hole 132 of the hanging-preventing portion 130 is positioned on the main body 200. In other words, when the user opens the monitor 10, the waterproof cover structure 100 may be hanging in the air and prevented from being dropped and lost through the design of the hanging-preventing portion 130.

In addition, in the present embodiment, the main body 200 includes a first locking portion 210. When the waterproof cover structure 100 is assembled onto the main body 200, a second locking portion 114 (i.e., the locking portion)

corresponds to the first locking portion 210 and is locked to the first locking portion 210. In this case, the first locking portion 210 is, for example, a slot, and the second locking portion 114 is, for example, a bump, but the invention is not limited thereto. In other embodiments that are not shown, the first locking portion 210 may also be a bump, and the second locking portion 114 may be a slot, which still fall within the scope sought to protect by the invention.

In brief, in the design of the monitor 10 of the present embodiment, the waterproof cover structure 100 may be disassembled from the main body 200. When the waterproof cover structure 100 is assembled onto the main body 200, the waterproof sealing ring 120 applies the pressure to the first pair of side surfaces 202 and the second pair of side surfaces 204 of the main body 200, thereby achieving the sealing and waterproof effect. Thus, the assembly of the main body 200 and the waterproof cover structure 100 of the monitor 10 in the present embodiment does not require any screws, which may have a shorter assembly time, less assembly cost and preferable assembly convenience. In addition, when the user opens the monitor 10, the waterproof cover structure 100 may be hanging in the air and prevented from being dropped and lost through the design of the hanging-preventing portion 130.

Based on the above, in the design of the waterproof cover structure of the invention, the ring-shaped rib of the cover body is embedded in the ring-shaped slot of the waterproof sealing ring, such that the waterproof sealing ring can be fixed onto the cover body, thereby forming the waterproof cover structure capable of waterproofing. In addition, as for the monitor of the invention, its waterproof sealing ring of the waterproof cover structure abuts on the first pair of side surfaces and the second pair of side surfaces of the main body, such that the waterproof cover structure can be assembled onto the main body, thereby achieving an effect of preventing water from penetrating into the main body. In other words, the main body of the monitor and the waterproof cover structure can be assembled to each other in the present embodiment, without being locked together using screws, which may have a shorter assembly time, less assembly cost and preferable assembly convenience.

Although the present invention has been described with reference to the embodiments thereof, it will be apparent to one of the ordinary skills in the art that modifications to the described embodiments may be made without departing from the spirit of the invention. Accordingly, the scope of the invention will be defined by the attached claims not by the above detailed description.

What is claimed is:

1. A waterproof cover structure, comprising:
   a cover body, having a disposition surface and comprising a ring-shaped rib, wherein the ring-shaped rib is located on the disposition surface and adjacent to an edge of the disposition surface;
   a waterproof sealing ring, detachably assembled onto the cover body and having a ring-shaped slot, wherein the ring-shaped rib is embedded in the ring-shaped slot, so as to fix the waterproof sealing ring onto the cover body; and
   a hanging-preventing portion, disposed on the disposition surface of the cover body, wherein the hanging-preventing portion is located in a ring-shaped area circled by the ring-shaped rib without directly contacting the ring-shaped rib, and the hanging-preventing portion and the waterproof sealing ring are integrally formed.

2. The waterproof cover structure according to claim 1, wherein the cover body further comprises:
   a locking portion, disposed at an outer side of the ring-shaped rib and located on the disposition surface.

3. The waterproof cover structure according to claim 2, wherein the locking portion and the ring-shaped rib are integrally formed.

4. A monitor, comprising:
   a main body, having a first pair of side surfaces opposite to each other and a second pair of side surfaces opposite to each other; and
   a waterproof cover structure, detachably assembled onto the main body, wherein the waterproof cover structure comprises:
   a cover body, having a disposition surface and comprising a ring-shaped rib, wherein the ring-shaped rib is located on the disposition surface and adjacent to an edge of the disposition surface;
   a waterproof sealing ring, detachably assembled onto the cover body and having a ring-shaped slot, wherein the ring-shaped rib is embedded in the ring-shaped slot, so as to fix the waterproof sealing ring onto the cover body; and
   a hanging-preventing portion, disposed on the disposition surface of the cover body, wherein the hanging-preventing portion is located in a ring-shaped area circled by the ring-shaped rib without directly contacting the ring-shaped rib, and the hanging-preventing portion and the waterproof sealing ring are integrally formed,
   when the waterproof cover structure is assembled onto the main body, the waterproof sealing ring abuts on the first pair of side surfaces and the second pair of side surfaces, and the hanging-preventing portion is fixed in the main body.

5. The monitor according to claim 4, wherein the main body comprises a first locking portion, and the cover body further comprises a second locking portion, the second locking portion is disposed at an outer side of the ring-shaped rib and located on the disposition surface, and when the waterproof cover structure is assembled onto the main body, the second locking portion corresponds to the first locking portion.

6. The monitor according to claim 5, wherein the second locking portion and the ring-shaped rib are integrally formed.

7. The monitor according to claim 4, wherein a shape contour of the waterproof cover structure is a rectangular shape.

8. The monitor according to claim 4, wherein when the waterproof cover structure is assembled onto the main body, the waterproof cover structure and the main body are coplanar.

* * * * *